United States Patent [19]

Miyashita et al.

[11] Patent Number: 5,558,015

[45] Date of Patent: Sep. 24, 1996

[54] HOT PRESS WITH PRESSURE VESSELS TO UNIFORMLY DISTRIBUTE PRESSURE TO THE WORK PIECE

[75] Inventors: Akimi Miyashita, Toride; Mutsumasa Fujii, Ibaraki-ken; Haruo Mishina, Ushiku, all of Japan

[73] Assignee: Hitachi Techno Engineering Co., Ltd., Tokyo, Japan

[21] Appl. No.: 360,087

[22] Filed: Dec. 20, 1994

[30] Foreign Application Priority Data

Dec. 28, 1993 [JP] Japan .................... 5-335428

[51] Int. Cl.⁶ .............. B30B 15/34; B30B 5/02
[52] U.S. Cl. ............... 100/50; 100/90; 100/93 P; 100/211; 156/358; 156/382; 156/583.3; 425/405.1; 425/407
[58] Field of Search .............. 100/50, 90, 93 P, 100/211; 156/358, 382, 581, 583.3; 425/405.1, 407

[56] References Cited

U.S. PATENT DOCUMENTS

| | | | |
|---|---|---|---|
| 1,806,861 | 5/1931 | Owen | 100/93 P |
| 1,878,899 | 9/1932 | Sherts | 100/211 |
| 2,172,002 | 9/1939 | Stanley | 100/50 |
| 2,431,943 | 12/1947 | Land et al. | 100/211 |
| 2,646,105 | 7/1953 | Langer | 100/93 P |
| 3,964,958 | 6/1976 | Johnston | 100/211 |
| 4,734,155 | 3/1988 | Tsunoda et al. | 100/211 |
| 5,297,480 | 3/1994 | Miyashita et al. | 100/90 |

FOREIGN PATENT DOCUMENTS

| | | | |
|---|---|---|---|
| 2634682 | 2/1990 | France | 100/211 |
| 2255762 | 5/1973 | Germany | 156/583.3 |
| 59-215299 | 12/1984 | Japan . | |
| 61-43565 | 3/1986 | Japan . | |
| 61-43543 | 3/1986 | Japan . | |
| 61-98528 | 5/1986 | Japan | 156/583.3 |
| 62-156931 | 7/1987 | Japan . | |
| 3-128195 | 5/1991 | Japan . | |

Primary Examiner—Stephen F. Gerrity
Attorney, Agent, or Firm—Antonelli, Terry, Stout & Kraus

[57] ABSTRACT

A hot press used, for example, for producing a thin printed board and a multilayered board, such as liquid crystal glass board bonded by a low-viscosity adhesive, and to a hot press suitable for forming a board requiring uniform bonding pressure. A hot press includes an upper and a lower bolster arranged in vertically opposed relation to each other, an upper and a lower heat plate respectively disposed in opposed relation to the upper and lower bolsters, a device for moving at least one of the upper and lower bolsters toward the other to produce a pressing force between the upper and lower heat plates, and pressure vessels respectively mounted on the heat plates. Each pressure vessel is made of a thin film and is filled with a fluid heating medium. When substrate blanks are interposed between the upper and lower pressure vessels and pressed by them, surface pressure for adhesive bonding becomes uniform, and heat from the heat plates is uniformly transferred to the blanks.

10 Claims, 9 Drawing Sheets

HOT PRESS WITH PRESSURE VESSELS TO UNIFORMLY DISTRIBUTE PRESSURE TO THE WORK PIECE

BACKGROUND OF THE INVENTION

This invention relates to a hot press used, for example, for producing a thin printed board (substrate) and a multilayered board such as a liquid crystal glass board bonded by a low-viscosity adhesive, and more particularly to a hot press suitable for forming a board requiring a uniform bonding pressure.

Generally, a printed board is produced as follows. A predetermined number of printed circuit boards, having respective predetermined circuit patterns printed thereon, and a predetermined number of prepregs, each formed by impregnating a cloth substrate with an adhesive resin, are alternately stacked, and these materials (the stacked printed circuit boards and prepregs) of the printed board are heated and pressed by heat plates. Then, simultaneously with a temperature rise, the adhesive resin is brought from a softened, fluidized condition into a lowest viscosity condition. Thereafter, as chemical reactions proceed, the adhesive resin is brought into a cured, stable condition. As a result, the plurality of printed circuit boards are integrally bonded together by the adhesive resin of the prepregs to produce a multilayered printed board.

In order to eliminate voids between the layers of the printed board and also to achieve uniform-thickness forming so as to achieve a high-density construction of the printed board, there has been proposed a method in which the process is carried out in a vacuum atmosphere until the adhesive resin of the prepregs is softened and fluidized, and then during a curing stage following the fluidization, the process is carried out in an atmosphere of high-pressure gas.

For example, Japanese Patent Unexamined Publication No. 3-128195 discloses a method in which, using heat plates for heating blanks of a multilayered board (substrate) as well as upper and lower bolsters for pressing the blanks of the multilayered board through these heat plates, heat and pressure are applied uniformly to the multilayered board blanks, and space between the upper and lower bolsters is enclosed by a sealing means, and the interior of this sealing means is kept at a vacuum (subatmospheric pressure) until the adhesive resin of the prepregs is softened and fluidized, and then the interior of the sealing means is kept to a high-pressure (air pressure) atmosphere during a curing stage following the fluidization of the adhesive resin. By this method, the pressure distribution is made uniform at the time of adhesively bonding the blanks of the multilayered board.

Japanese Patent Unexamined Publication No. 59-215299 discloses a method in which, with respect to the configuration of pressing surfaces, buffer plates, provided at heat plates, are changed into a configuration, meeting with bonding conditions, by the use of auxiliary rams in bolsters, so that a bonding operation can be effected with a proper surface pressure distribution.

Japanese Patent Unexamined Publication Nos. 61-43543 and 61-43565 disclose a uniform-pressure forming method in which a high-pressure vessel called an "autoclave" is used, blanks of a multilayered board are covered with a film or a sheet, the interior of this cover film or sheet is reduced in pressure, and then the multilayered board blanks are heated and pressed within the high-pressure vessel, using $N_2$ gas or $CO_2$ gas.

In order to achieve high-precision uniform-thickness forming by the uniform pressure in the above board bonding process, an attempt has been made to effect the pressing with an improved surface precision of the press. However, the improvement of the surface precision is limited, and besides the board blanks to be bonded together have themselves ruggedness, undulations, and so on, and therefore there has been a limit to the uniform-pressure pressing by the surface pressing.

Particularly when bonding thin glass board blanks together, a low-viscosity adhesive is used under a low pressure so as to prevent breakage of the glass board blanks. However, under such a low pressure, uniform pressing cannot be effected because the glass board blanks have undulations and so on, which has resulted in a problem that the thickness of the formed products has varied.

To produce a board of a special inner layer construction or a board of the type, such as a metal board and a glass board, in which adhesives of different properties are distributed therein (for example, a board in which a low-viscosity adhesive is used generally over the entire area thereof while a high-viscosity adhesive is used locally), there are occasions when a high-precision uniform-thickness forming can be achieved using local pressing in addition to uniform-pressure pressing.

However, the conventional bonding operation for the board has depended mainly on the application of pressure to the viscous fluid as described above, and has been directed to the application of a uniform pressure to this fluid. In those boards in which a large amount of high-rigidity substances are present in the direction of application of the pressure, while the viscous fluid is present in a very small amount in this direction, the precision of the board thickness is lowered in the vicinity of the high-rigidity substances under the influence of these high-rigidity substances in the board. The precision of the board thickness may be enhanced by locally increasing the pressure of those portions containing the high-rigidity substances; however, with a press it has heretofore been impossible to locally increase the pressure, although the pressure distribution can be gently varied.

SUMMARY OF THE INVENTION

It is an object of this invention to provide a hot press suited for forming a board with a high-precision board thickness at low costs by achieving uniform-pressure pressing.

Another object of the invention is to provide a hot press capable of forming a board of a high quality with a uniform finish board thickness even if adhesives of different properties are distributed therein.

According to one aspect of the present invention, there is provided a hot press which comprises upper and lower bolsters arranged in vertically opposed relation to each other, upper and lower heat plates disposed in opposed relation to the upper and lower bolsters, respectively, and means for moving at least one of the upper and lower bolsters toward the other to produce a pressing force between the upper and lower heat plates, wherein substrate blanks are inserted between the upper and lower heat plates and are pressed and heated to produce a board (substrate), and wherein pressure vessels, each made of a thin film and filled with a fluid heating medium, are provided so that when the substrate blanks are interposed between the upper and lower heat plates, a uniform surface pressure for adhesive bonding can be obtained, and besides the heat of the heat plates can be transferred uniformly to the substrate blanks.

With this construction of the present invention, although the substrate blank-pressing surfaces of the heat plates are brought into intimate contact with the surfaces of the substrate blanks, the pressure is transmitted uniformly in the vessel because of the presence of the fluid heating medium, and therefore the substrate blanks are pressed uniformly through the vessels. As a result, the board (substrate) with a precise board thickness can be produced at low costs.

According to another aspect of the present invention, there is provided a hot press which comprises upper and lower bolsters arranged in vertically opposed relation to each other, upper and lower heat plates disposed in opposed relation to the upper and lower bolsters, respectively, and means for heating and cooling at least one of the upper and lower heat plates, wherein substrate blanks are inserted between the upper and lower heat plates, and are pressed and heated to produce a board (substrate), wherein pressure vessels each comprising a plurality of partition chambers are provided respectively on those surfaces of the upper and lower heat plates for respectively pressing the substrate blanks, and wherein means is provided for supplying fluid heating mediums of predetermined different pressures respectively to the plurality of partition chambers.

Each of the partition chambers of the pressure vessel comprises vertically-expansible and contractible partition walls and soft thin films for pressing the substrate blank.

With this construction, in the substrate blank-bonding process the fluid pressure in the partition chambers is varied locally, so that the substrate blanks can be pressed in accordance with the difference in characteristics of adhesives in the board, thereby achieving a uniform finish board thickness.

DESCRIPTION OF THE PREFERRED EMBODIMENTS

Figure 1:
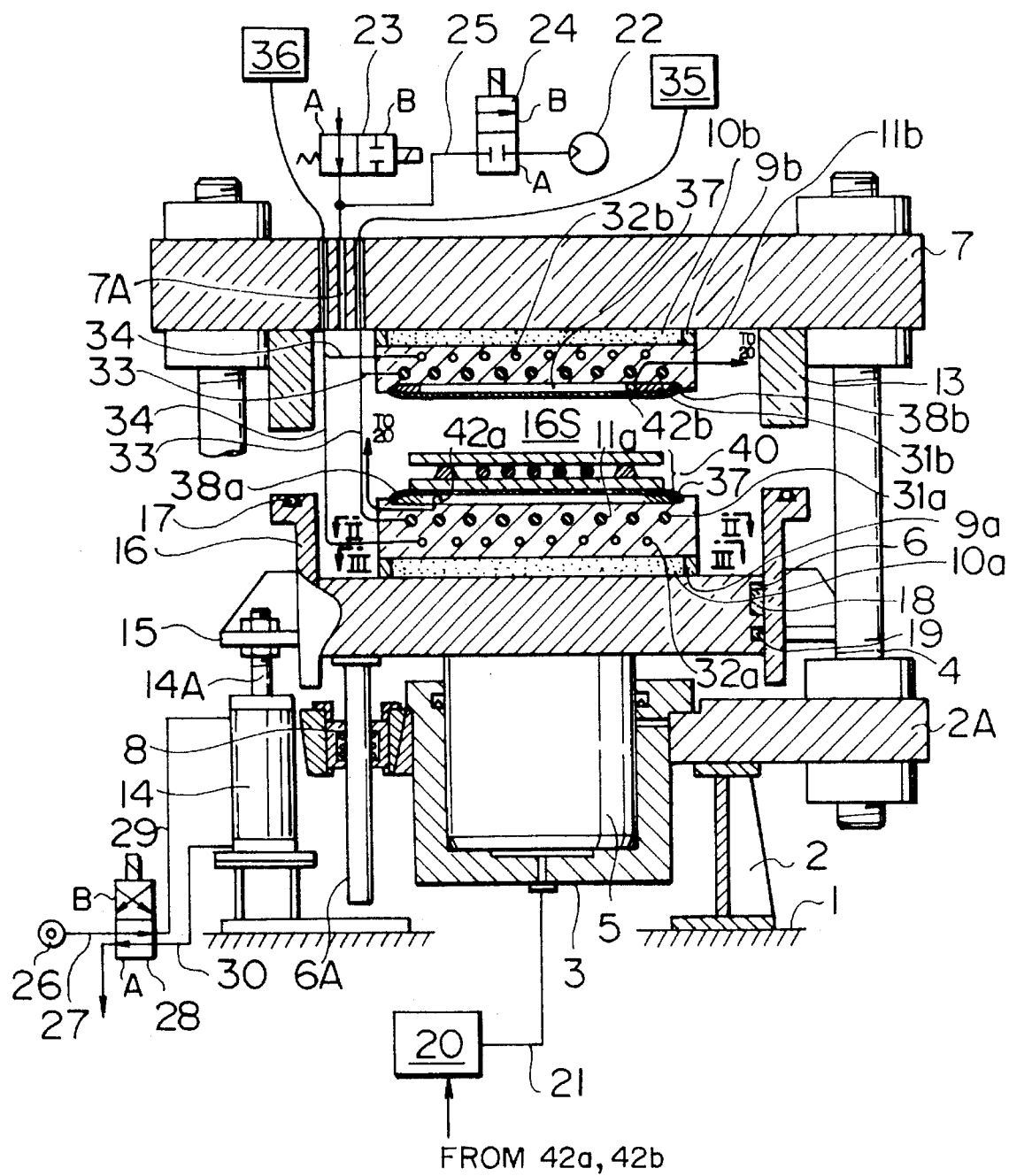
FIG. 1 is a vertical cross-sectional view of a first embodiment of a hot press of the present invention.

Preferred embodiments of a hot press of the present invention will now be described with reference to the accompanying drawings.

FIGS. 1 to 4 shows a first embodiment of a hot press of the present invention for producing a thin glass board (substrate).

In the embodiments described hereinafter, suffixes a added to reference numerals indicate that the relevant portions are disposed on the lower side of substrate (board) blanks 40 (later described) while suffixes b indicates that the relevant portions are disposed on the upper side of the substrate blanks 40. For example, in FIG. 1, reference numeral 31a denotes a heating member disposed on the lower side of the substrate blanks 40, and reference numeral 31b denotes a heating member disposed on the upper side of the substrate blanks 40. When collectively referring to these portions, the suffixes a and b are omitted, and for example the term "heating member 31" will be used.

In these figures, a base frame 2 is mounted on a floor 1, and a base plate 2A is fixedly mounted on an upper portion of the base frame 2.

A main hydraulic cylinder 3 and a plurality of (for example, four) support posts 4 are fixedly mounted on the base plate 2A, as shown in FIG. 1.

A main ram 5 is received in the main hydraulic cylinder 3. The main hydraulic cylinder 3 is connected to a hydraulic power source 20 via an oil pipe 21.

A lower bolster 6 is mounted on the main ram 5 and is guided by a plurality of support posts 6A, mounted thereon, and a plurality of guide bearings 8, mounted on the base plate 2A, for upward and downward movement. An upper bolster 7 is fixedly mounted on upper portions of the support posts 4, mounted upright on the base plate 2A, in opposed relation to the lower bolster 6.

A lower heat plate 11a of a rectangular shape is mounted on an upper surface of the lower bolster 6 through a heat insulating plate 10a surrounded by a lower frame plate 9a. An upper heat plate 11b of a rectangular shape is mounted on a lower surface of the upper bolster 7 through a heat insulating plate 10b surrounded by an upper frame plate 9b. A tubular receiving ring 13 for forming a sealed space is fixedly secured to the lower surface of the upper bolster 7. A tubular ring 16 is mounted around an outer periphery of the lower bolster 6 and is supported through brackets 15 by rods 14A of a plurality of (for example, four) pneumatic cylinders 14, fixedly mounted on the base frame 2, for upward and downward movement. The pneumatic cylinders 14 may be fixedly mounted on the base plate 2A. The pneumatic cylinder 14 is arranged between any two adjacent ones of the support posts 4. The tubular ring 16 is guided by a tubular guide 18 provided on the outer periphery of the lower bolster 6, and a tubular side seal member 19 provided on the lower bolster 6 seals a gap between an inner periphery of the tubular ring 16 and the outer periphery of the lower bolster 6, thus providing a air-tight construction.

An annular end seal member 17 is provided at an upper surface of the tubular ring 16 in opposed relation to the tubular receiving ring 13. When the tubular ring 16 is brought into intimate contact with the tubular receiving ring 13, the upper and lower bolsters 7 and 6 and the tubular receiving ring 13 and the tubular ring 16 jointly form a sealed space 16S. A vacuum pump 22 is provided outside of the sealed space 16S, and is connected to this sealed space 16S via a hole 7A, formed through the upper bolster 7 and disposed inwardly of the tubular receiving ring 13, a pipe 25 and a change-over valve 24. The pipe 25 is branched halfway, and this branch is connected to a vacuum breaker 23.

A pipe 29 is connected to an upper portion of each of the pneumatic cylinders 14, and a pipe 30 is connected to a lower portion of each of the pneumatic cylinders 14. An air pressure source 26 for supplying pressurized air is connected through a change-over valve 28 to the pipes 29 and 30 in a change-over manner.

When the change-over valve 28 is changed over or switched, pressurized air is supplied to the lower portion of each pneumatic cylinder 14 via the pipe 30, while the pressurized air is discharged from the upper portion of the pneumatic cylinder 14 to the atmosphere via the pipe 29, so that the tubular ring 16 moves upward and cooperates with the tubular receiving ring 13 to form the sealed space 16S therebetween. On the other hand, when the pressurized air is discharged from the lower portion of each pneumatic cylinder 14 to the atmosphere via the pipe 30 while the pressurized air is supplied to the upper portion of the pneumatic cylinder 14 via the pipe 29, the tubular ring 16 moves downward.

Figure 2:
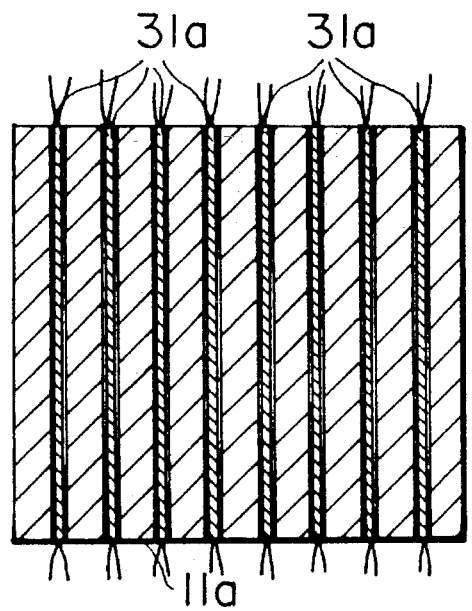
FIG. 2 is a cross-sectional view of a portion of a heat plate taken along the line II—II of FIG. 1.
Figure 3:
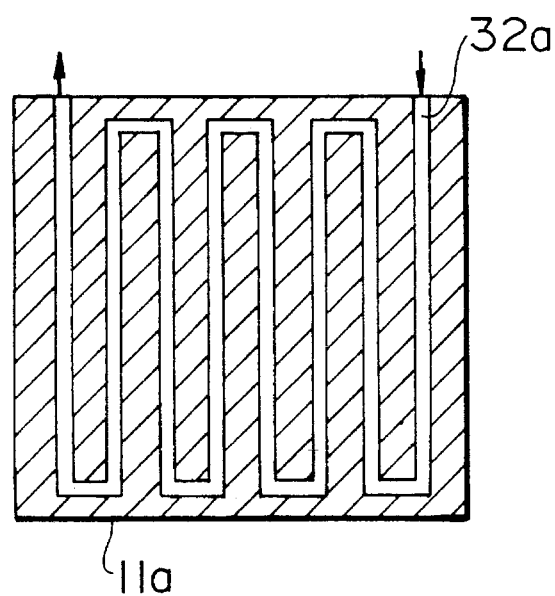
FIG. 3 is a cross-sectional view of a portion of the heat plate taken along the line III—III of FIG. 1.

As shown in FIGS. 1 to 3, heating members 31 and cooling medium passages 32 are provided in the interiors of the heat plates 11. An electric heater or the like is used as the heating members 31.

A plurality of heating members 31 are arranged at predetermined intervals in juxtaposed relation, and each heating member 31 is connected to a heat source (e.g. electric power source) 35 via a wire 33, as shown in FIG. 1.

The cooling medium passage 32 is arranged in a zigzag fashion as shown in FIG. 3 and is connected to a cooling source (e.g. cooling medium producing device) 36 via a cooling hose 34 as shown in FIG. 1.

As shown in FIG. 1, a plate-like vessel 38a, made of a thin film and filled with a fluid (liquid) heating medium 37, is formed on an upper surface of the lower heat plate 11a, and substrate blanks 40 are supplied onto the upper surface of this vessel 38a by a loader (not shown) or the like and are positioned there.

As in the lower heat plate 11a, a plate-like vessel 38b, made of a thin film and filled with a fluid (liquid) heating medium 37, is formed on a lower surface of the upper heat plate 11b.

As the heating medium 37, there is used a synthetic heating medium oil or the like which has a high boiling point, which can be heated to high temperatures, and which is excellent in thermal stability. As the material for the plate-like vessel 38 of a thin film, there is used a metal sheet or a fluororubber sheet having an excellent thermal resistance, the thickness of this material being about 0.1 mm.

Referring to the structure of the vessel 38, a groove or recess of a flattened U-shape with a small depth is formed in the upper (lower) surface of the lower (upper) heat plate 11a (11b), and the thin film is connected watertight at its entire peripheral edge to the entire peripheral edge of this U-shaped groove, and the fluid (liquid) heating medium 37 is filled in a space formed between the thin film and the upper (lower) heat plate 11b (11a).

Pressure detection means 42a and 42b are provided within the plate-like vessels 38a and 38b, respectively, and detection results are used for controlling the pressing force of the main ram 5. If the control of the pressing force of the main ram 5 does not need the detection results of the pressure detection means 42a and 42b, the provision of these means 42a and 42b can be omitted.

The operation of the hot press of the above construction will now be described.

First, the substrate (board) blanks 40 are inserted between the plate-like vessels 38a and 38b, provided respectively on the lower and upper heat plates 11a and 11b, and are positioned on the upper surface of the lower heat plate 11a in a stacked or superposed manner.

Then, the change-over valve 28 is switched from a port A to a port B to supply the high-pressure air into the lower portion of each of the pneumatic cylinders 14 via air pipes 27 and 30, thereby moving the tubular ring 16, connected directly to the brackets 15, upward by the rods 14A of the pneumatic cylinders 14, so that the annular end seal member 17 is brought into intimate contact with the tubular receiving ring 13 to form the sealed space 16S between the upper bolster 7 and the lower bolster 6.

Then, the change-over valve 24 for the vacuum pump 22 is switched to a communicating side (that is, from a port A to a port B), and at the same time the vacuum breaker 23 is closed (that is, switched from a port A to a port B), and the air is discharged from the sealed space 16S via the pipe 25.

Figure 4:
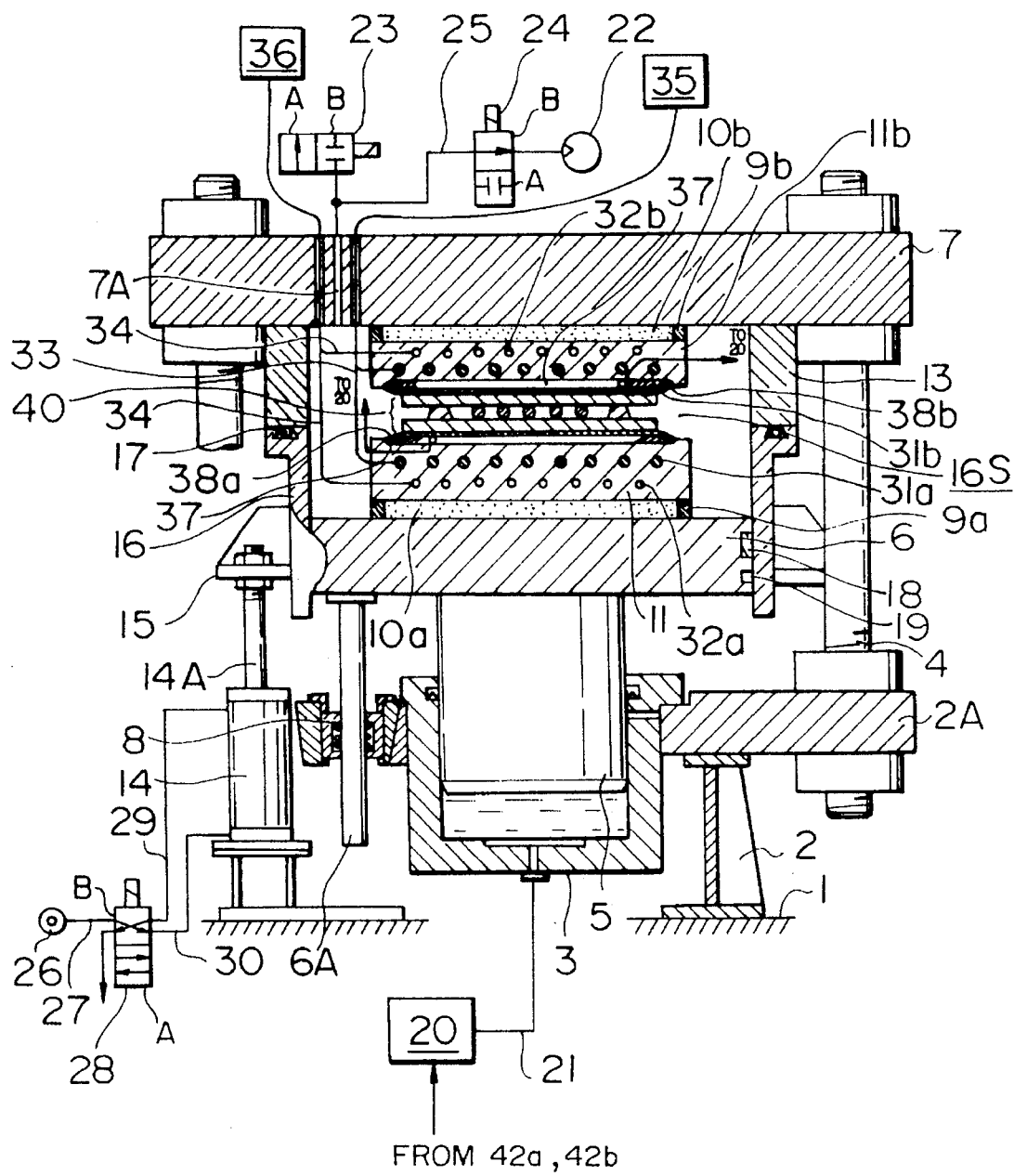
FIG. 4 is a cross-sectional view of the hot press of FIG. 1, showing a bonding operation.

Then, oil of a predetermined high pressure is supplied to the main hydraulic cylinder 3 from the hydraulic power source 20 via the oil pipe 21 to thereby move the lower bolster 6 upward through the main ram 5, as shown in FIG. 4. As a result, the plate-like vessels 38 are first brought into contact with convex portions of the substrate blanks 40 through the upper and lower heat plates 11b and 11a. Pressure developing at the area of contact between each plate-like vessel 38 and the corresponding substrate blank 40 at this time is dispersed over the entire area of the liquid heating medium, and therefore is converted into a force deforming the whole of the plate-like vessel 38. Thus, this pressure is dispersed to be converted into a very low pressure. Therefore, a displacement between the upper and lower substrate blanks 40 which would otherwise occur upon contact with the convex portions at the initial stage of the pressing operation is avoided. In accordance with the movement of the lower bolster 6, each plate-like vessel 38 is brought into contact with the surface of the corresponding substrate blank 40, while gradually being deformed in conformity with this surface, and is held in intimate contact with the entire surface of the substrate blank 40. Because of the intimate contact of each plate-like vessel 38 with the corresponding substrate blank 40, heat transfer pressing can be carried out under a uniform surface pressure.

Therefore, there can be obtained the board which is free from displacement and has a uniform thickness. At this time, the substrate blanks 40 are heated at a temperature of about 100° C. to about 170° C., and are pressed at a surface pressure of 0.8~1.5 kgf/cm$^2$ (8~15 kgf/cm$^2$ in the case of a printed board).

Figure 5:
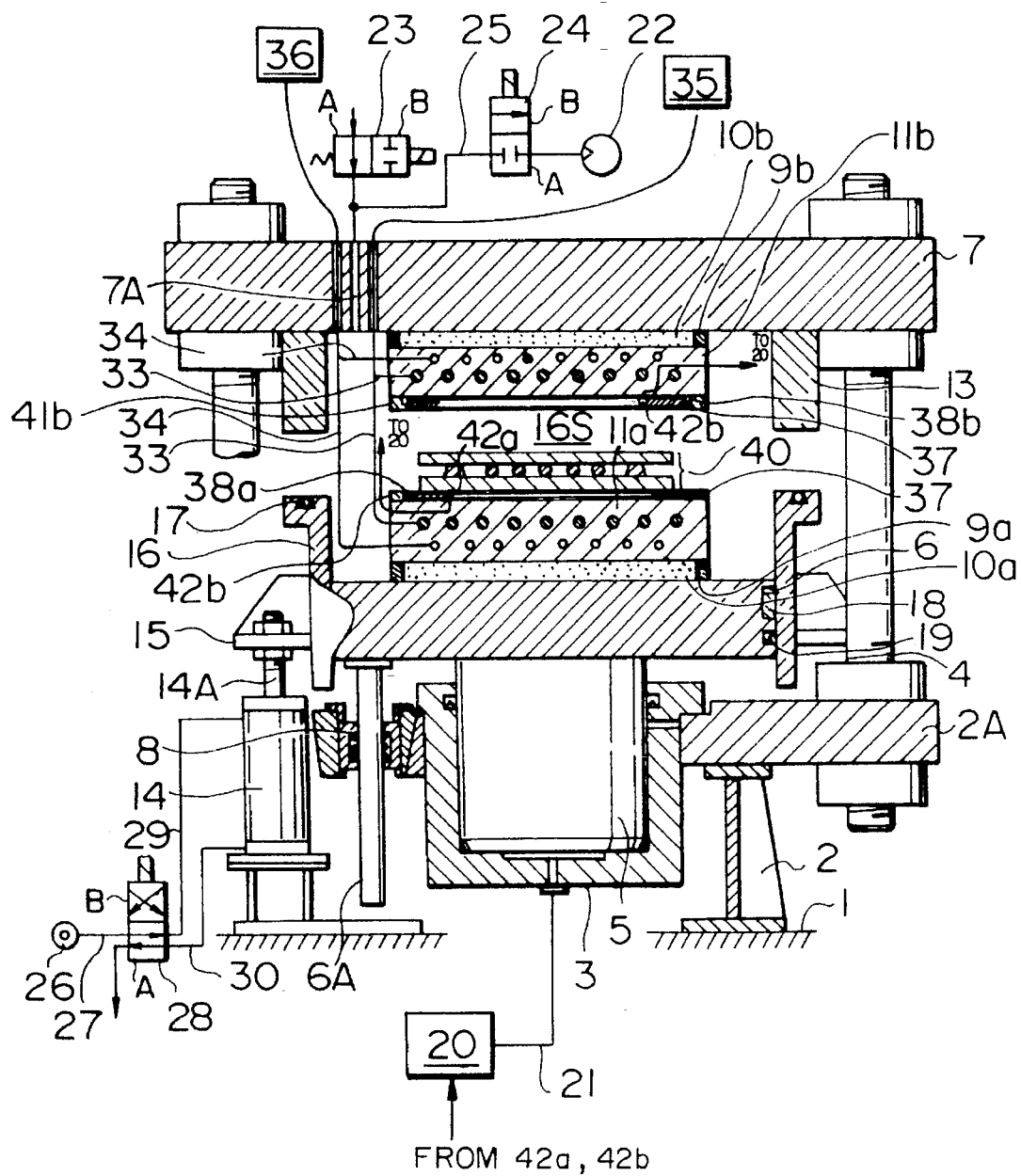
FIG. 5 is a vertical cross-sectional view of a second embodiment of a hot press of the present invention.
Figure 6:
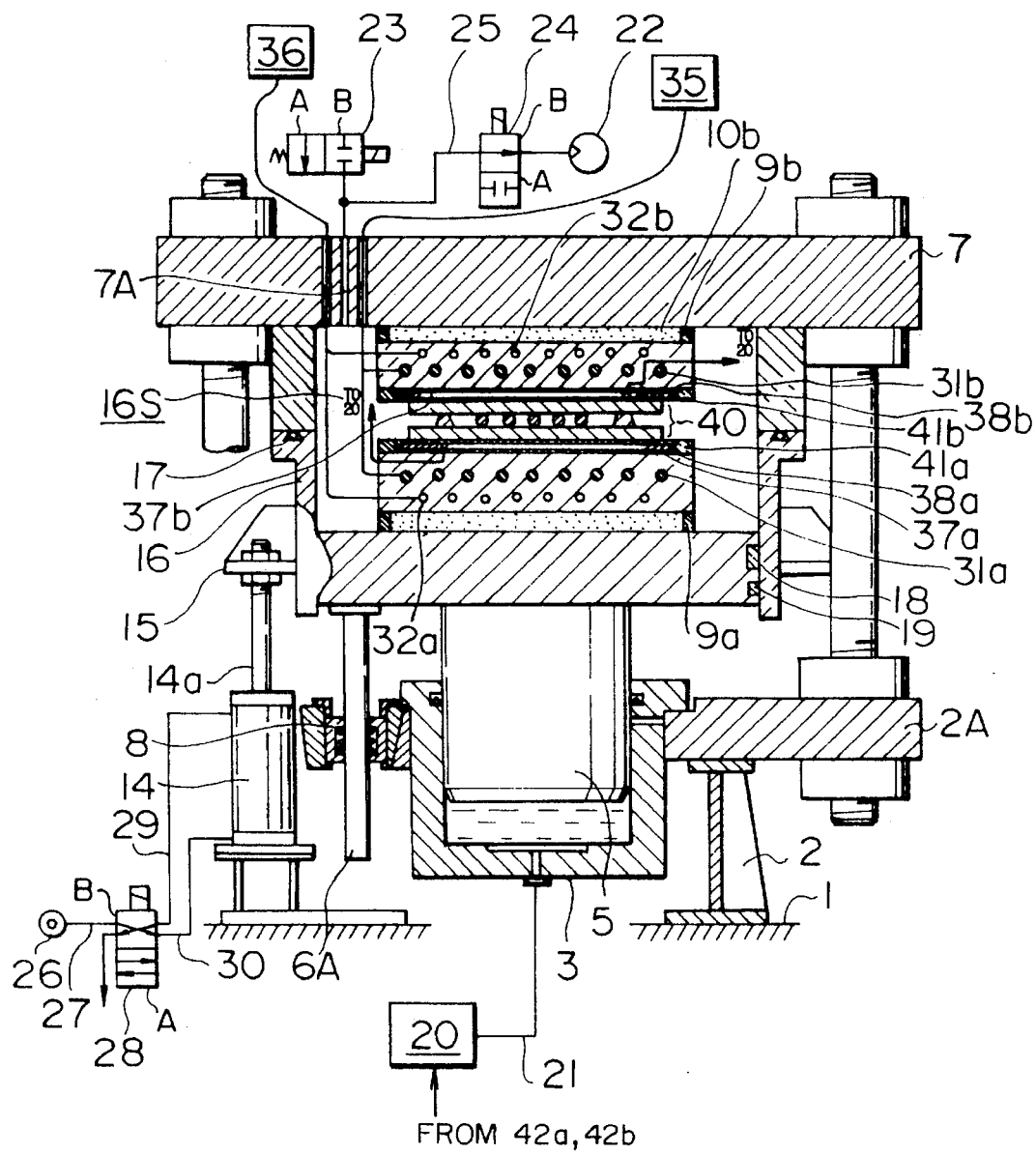
FIG. 6 is a cross-sectional view of the hot press of FIG. 5, showing a bonding operation.
Figure 7:
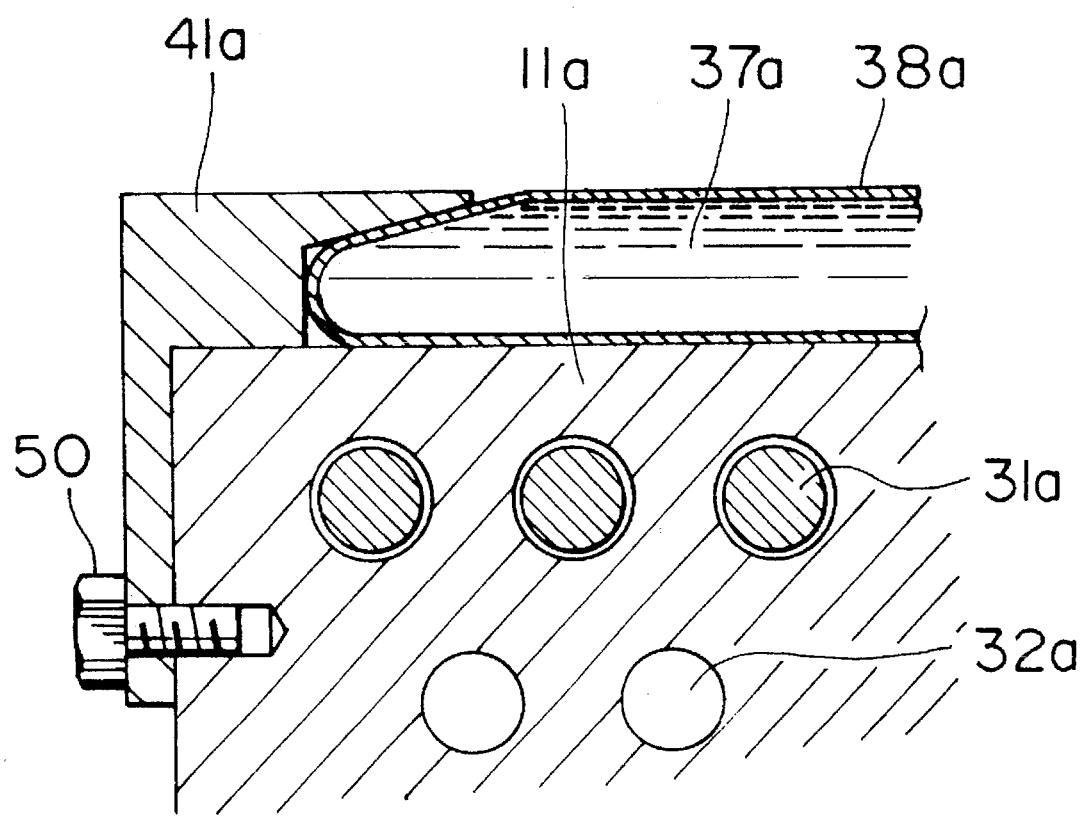
FIG. 7 is a detailed view of a portion of the hot press of FIG. 5.

FIGS. 5 to 7 show a second embodiment of a hot press of the present invention. Those portions of this embodiment identical to those of the preceding embodiment are denoted by the same reference numerals, respectively, and explanation thereof will be omitted.

In this second embodiment, a plate-like vessel 38 of a thin film separate from a heat plate 11 is mounted on the heat plate 11, and is supported on the heat plate 11 by a support member 41, the plate-like vessel 38 being filled with a heating medium 37. The support member 41, much like a picture frame, is provided at the peripheral edge portion of the heat plate 11 to hold the plate-like vessel 38 of a thin film and is removably secured to the heat plate 11 by fixing screws 50 passing through a side wall thereof, as shown on an enlarged scale in FIG. 7. By removing the support member 41, the plate-like vessel 38 of a thin film can be removed from the heat plate 11.

In this embodiment, even if the plate-like vessel 38 of a thin film is subjected to fatigue failure as a result of repeatedly effecting the heat-transfer pressing, this vessel can be easily exchanged by removing the support member 41, and therefore an easy maintenance is possible.

By periodically inverting the plate-like vessel 38 upside down such that the opposite sides of this vessel 38, respectively contacting the heat plate 11 and the substrate blank, are reversed, the lifetime of the plate-like vessel 38 of a thin film can be prolonged. Further, in the event of a fatigue failure, it is only necessary to exchange the plate-like vessel 38, and this is economical.

In the above embodiments, the heating members 31 are contained in each of the upper and lower heat plates 11b and 11a. However, if the substrate blanks 40 are thin, the heating members 31 may be contained only in the upper heat plate 11b or the lower heat plate 11a.

In the above embodiments, although the heating members 31 contained in the heat plate 11 comprises an electric heater, any other suitable means than the electric heater may be used in so far as it can effect the heating, and for example the heating members may comprise a pipe-like heat exchanger through which a high-temperature fluid from a heat source is circulated via a heat hose.

In the above embodiments, although the pressing force is adjusted by the hydraulic power source 20 for the main ram 5, the pressure detection means 42a and 42b for detecting the pressure of the heating medium 37 during the pressing operation may be provided in the plate-like vessels 38a and 38b, respectively, in which case the pressing force of the ram 5 is controlled in accordance with detection values of the pressure detection means 42a and 42b. In this case, the pressure of the pressing surfaces can be accurately detected, and therefore this is suitable for the pressing of fragile glass substrate.

In the above embodiments, although only the upper and lower heat plates 11b and 11a are used, one or more intermediate heat plates may be provided between the upper and lower heat plates 11b and 11a, in which case the substrate blank is interposed between any two adjacent ones of the heat plates, and further a vessel of a thin film filled with a fluid heating medium may be provided on each of upper and lower sides of each of the intermediate heat plates.

In the above embodiments, although the lower bolster 6 is moved toward the upper bolster 7, the hot press may be of such a construction that the upper bolster is movable toward the lower bolster.

A third embodiment of a hot press of the present invention will now be described with reference to FIGS. 8 to 11.

In this embodiment, a lower bolster 6 is fixedly mounted on a base plate 2A through a support structure 2B. The lower bolster 6 is fixed, and instead pressure vessels 51a and 51b are fixedly mounted respectively on lower and upper heat plates 11a and 11b by brackets 52 as shown on an enlarged scale in FIG. 10.

The pressure vessel 51 has three chambers 53A to 53C separated from one another by expansible and contractible side walls (partition walls) 51A to 51C each in the form of a bellows. Thin films 54 and 55 each made, for example, of a soft TEFLON® (polytetrafluoroethylene) rubber sheet are provided respectively on the upper and lower sides of the pressure vessel 51 disposed parallel to that surface of the heat plate 11a, 11b for pressing a substrate blank 40. The partition chambers 53A to 53C are connected to a heating medium source 61 by respective pipes 56 via respective pressure control valves 57 to 59 and a liquid feed pump 60. The pressure control valves 57 to 59 independently control the pressures of the partition chambers 53A to 53C, respectively, so that the three partition chambers 53A to 53C can be controlled to high, medium and low pressures, respectively.

Figure 8:
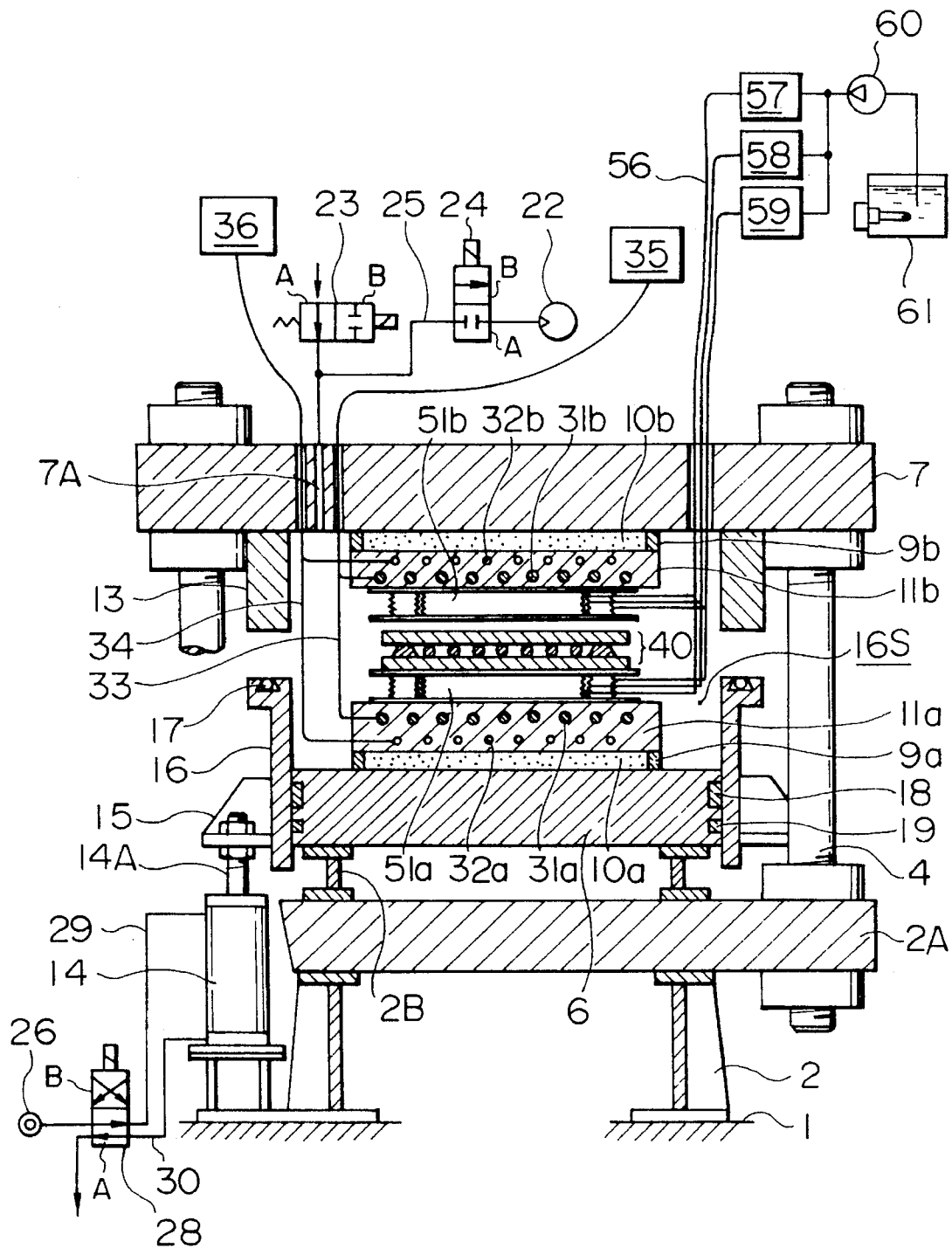
FIG. 8 is a vertical cross-sectional view of a third embodiment of a hot press of the present invention.

The embodiment of FIG. 8 is similar in construction to the embodiment of FIG. 1 except that the lower bolster 6 is fixed and that the partitioned pressure vessels 51 are provided, and therefore corresponding or identical portions are designated respectively by the same reference numerals used in FIG. 1, thereby omitting repeated explanation. The heat plates 11 are of the same construction as shown in FIGS. 2 and 3, and therefore the description thereof is omitted here.

The operation of the hot press of this construction will now be described.

The substrate blanks 40 are set on the lower pressure vessel 51a by a loader (not shown) as shown in FIG. 8. At this stage, heating mediums of equal pressure are supplied respectively to the partition chambers 53A to 53C of the pressure vessel 51, and when the substrate blanks 40 are set, they are laid flat on the thin film sheet 55a.

Figure 9:
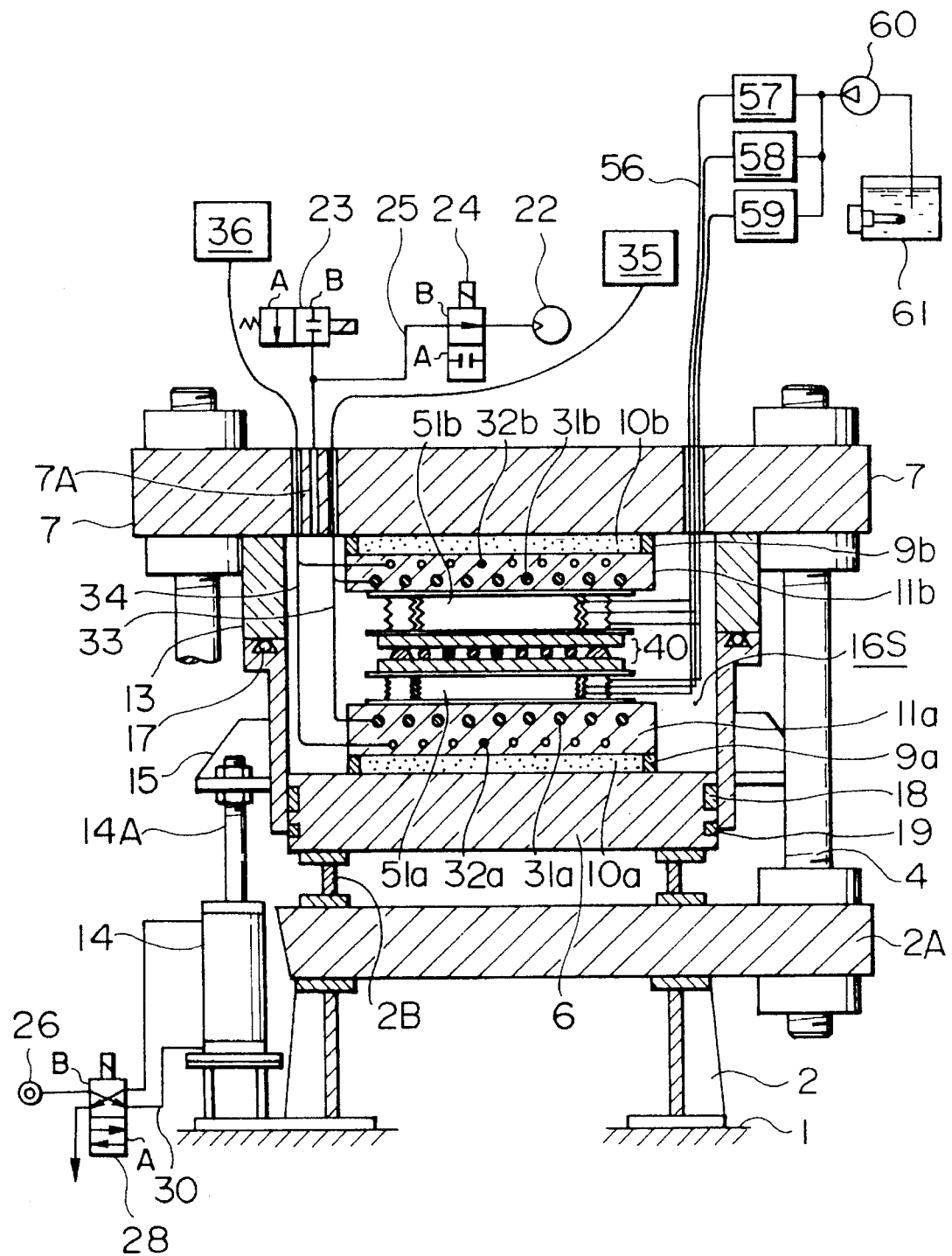
FIG. 9 is cross-sectional view of the hot press of FIG. 8, showing a bonding operation.
Figure 10:
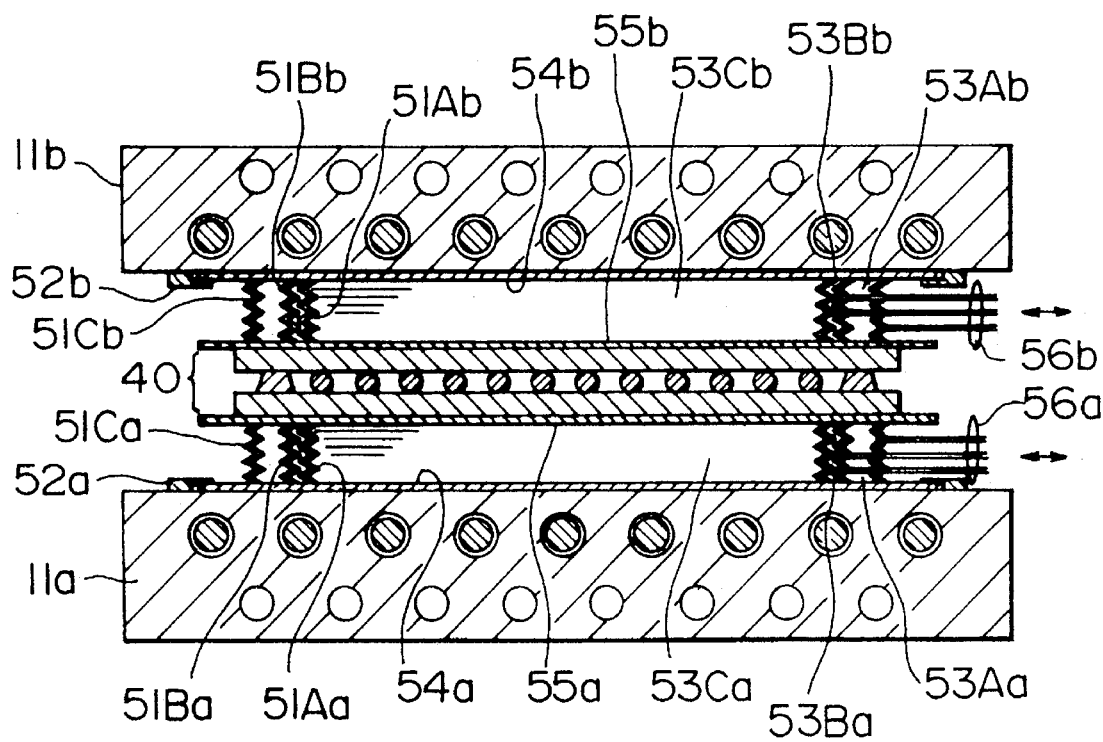
FIG. 10 is a detailed view of a portion of the hot press of FIG. 8.

First, change-over valve 28 is switched from port A to port B to supply the high-pressure air from an air pressure source 26 to the lower portion of each of pneumatic cylinders 14, thereby moving tubular ring 16, connected directly to brackets 15, upward by rods 14A of the pneumatic cylinders 14, so that seal member 17 is brought into intimate contact with tubular receiving ring 13 to form sealed space 16S between the upper and lower bolsters as shown in FIG. 9.

Then, change-over valve 24 for vacuum pump 22 is switched to port B, and also vacuum breaker 23 is closed, and the air is discharged from the sealed space 16S.

At the same time, the heating mediums of predetermined pressures are supplied by the pressure pump 60 respectively to the partition chambers 53A to 53C of each pressure vessel 51 through the respective pressure control valves 57 to 59.

By thus supplying the heating medium, the pressures of the partition chambers 53A to 53C increase, and the thin film sheets 55a and 55b for pressing purposes move upward and downward, respectively, so that the substrate blanks 40 are pressed between the upper and lower pressure vessels 51b and 51a.

For example, in the case of a glass board in which glass spacers are dispersed at central portions of substrate blanks, with a sealing adhesive coated on marginal portions of the substrate blanks, the pressure applied by the partition chamber 53A is 0.8~1.5 kgf/cm$^2$ (8~15 kgf/cm$^2$ in the case of a printed board), and the pressure applied by the partition chamber 53C is 0.5~1.0 kgf/cm$^2$ (5~10 kgf/cm$^2$ in the case of the printed board). The pressure applied by the intermediate partition chamber 53B is between the pressure of the partition chamber 53A and the pressure of the partition chamber 53C, or is set to the atmospheric pressure by communicating this chamber 53B with the atmosphere.

Figure 11:
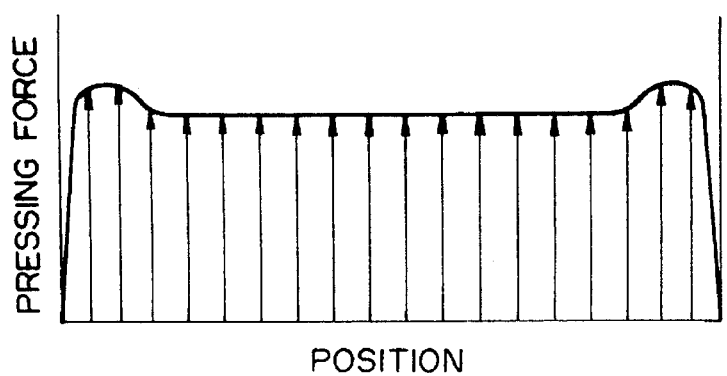
FIG. 11 is an illustration showing a pressure distribution of substrate blanks during the bonding operation of FIG. 9.

FIG. 11 shows the pressure distribution where the medium pressure is applied to the partition chamber 53B.

During the pressing operation, heat transfer from the heat plate 11 through the pressure vessel 51 is effected.

The adhesive, provided at the marginal portions of the substrate blanks, is sufficiently pressed locally with the high pressing force applied by the partition chamber 53A, thereby producing a positive bonding force.

Incidentally, when effecting a uniform pressing with a conventional apparatus, the pressing force is born by the glass spacers at central portions, and in some cases a sufficient force has failed to be applied to the sealing adhesive, thus resulting in incomplete bonding.

In the embodiment of FIG. 8, although the lower bolster 6 is fixedly mounted on the support structure 2B, the lower bolster 6 may be mounted on a main ram as in the embodiment of FIG. 1, so that the lower bolster is movable so as to facilitate the loading and unloading of the substrate blanks 40. In this case, the main ram may also serve to apply part of the pressing force, while fine adjustment may be effected by the pressure vessel. Alternatively, the main ram may be used for position adjusting purposes rather than for pressing purposes.

A heater may be provided at the pressure vessel 51 and the heating medium source 61 so that the heating medium can be preheated. With this arrangement, thermal stresses, produced when the blanks 40 are brought into contact with the thin films 55a and 55b, can be alleviated, and besides the temperature rise of the blanks 40 can be accelerated.

The number of the partition chambers of the pressure vessel 51, the configuration of the partition chambers, the pressures of the heating mediums applied respectively to the partition chambers and so on are determined in dependence upon the construction of the substrate blanks 40, and these are not limited to those of this embodiment.

In this embodiment, although the heating mediums of different pressures are applied respectively to the partition chambers, an equal pressure can be applied to these partition chambers by controlling the pressure control valves, when pressing the type of blanks 40 requiring uniform pressing.

As the heating medium, any suitable material may be used in so far as it is of a non-compressive nature and is excellent in thermal conductivity.

In dependence upon the construction of the substrate blanks 40, and for example where the rigidity of one side (face) of the blank is uniform while the other side is not uniform in rigidity, the provision of the pressure vessel for pressing the one side of the blank may be omitted, or a heating medium of uniform pressure may be applied to the one side while the heating mediums of different pressures are applied respectively to the partition chambers of that pressure vessel for pressing against the other side of the blank.

In accordance with the temperature rise of the upper and lower heat plates 11b and 11a, the pressures of the heating mediums, applied respectively to the partition chambers, may be kept equal at the initial stage, and then be increased by the use of a programmable controller, thus effecting the local pressing.

Pressure detection means as shown in FIGS. 1 and 5 may be provided respectively in the partition chambers 53A to 53C of the pressure vessel 51, in which case detection results of these pressure detection means are fed back to the pressure control valves 57 to 59, respectively, so that the pressures of the partition chambers 53A to 53C can be brought into their respective predetermined levels.

In the embodiments of FIGS. 1, 5 and 8, although the pair of substrate blanks 40 are set between the upper and lower bolsters 7 and 6, one or more intermediate heat plates (as designated at 9 and 10 in FIG. 1 of U.S. Pat. No. 4,963,221) may be provided between the upper and lower bolsters 7 and 6, in which case pressure vessels are provided respectively on opposite (upper and lower) sides of each of these intermediate heat plates, and a plurality of substrate blanks are interposed between the upper and lower bolsters 7 and 6 in such a manner that each set of substrate blanks are disposed between any two adjacent ones of the pressure vessels, thus producing a plurality of boards at the same time.

What is claimed is:

1. A hot press for producing a multilayered substrate, said hot press comprising:

upper and lower bolsters arranged in vertically opposed relation to each other and movable relative to and toward each other so as to press substrate blanks stacked therebetween;

upper and lower heat insulating plates;

a main ram for causing relative movement between said upper and lower bolsters to produce a pressing force;

upper and lower heat plates provided respectively on said upper and lower bolsters through said upper and lower heat insulating plates, respectively, said upper and lower heat plates adapted to be connected to a heat source;

pressure vessels provided respectively on said upper and lower heat plates for respectively pressing stacked substrate blanks, each of said pressure vessels being made of a thin film and being adapted to be filled with a fluid heating medium;

means for detecting pressure in each of said pressure vessels; and means for controlling the pressure of fluid heating medium in said pressure vessel in accordance with detection results of said pressure detection means.

2. A hot press according to claim 1, further comprising means for sealing a space between said upper and lower bolsters, means for creating a vacuum in the sealed space, and means for heating at least one of said upper and lower heat plates.

3. A hot press according to claim 1, in which each of said upper and lower heat plates includes a support member for removably holding the associated pressure vessel.

4. A hot press according to claim 1, in which said pressure vessels comprise thin films provided on said upper and lower heat plates, each said thin film being fixedly secured watertight to the respective heat plate at a peripheral edge portion of said thin film.

5. A hot press according to claim 1, in which each of said pressure vessels includes partition wall members providing a plurality of separated partition chambers, said hot press further comprising means for supplying fluid heating medium at predetermined pressures into said partition chambers.

6. A hot press for producing a multilayered substrate, said hot press comprising:

upper and lower bolsters arranged in vertically opposed relation to each other;

upper and lower heat insulating plates;

upper and lower heat plates provided respectively on said upper and lower bolsters through said upper and lower heat insulating plates, respectively, said upper and lower heat plates adapted to be connected to a heat source;

pressure vessels provided respectively on said upper and lower heat plates, for respectively pressing stacked substrate blanks, and adapted to be filled with a fluid heating medium;

means for detecting pressure in each of said pressure vessels; and means for controlling the pressure of fluid heating medium in said pressure vessel in accordance with detection results of said pressure detection means.

7. A hot press according to claim 6, wherein:

each of said pressure vessels comprises vertically-expansible and contractible side walls portions, and upper and lower soft thin films disposed parallel to the substrate blank-pressing surface, said side wall portions partitioning the interior of said pressure vessel into a plurality of partition chambers; and said hot press further comprises means for supplying fluid heating medium at predetermined pressures into said plurality of partition chambers of each of said pressure vessels.

8. A hot press according to claim 6, further comprising means for sealing a space between said upper and lower bolsters, means for creating a vacuum in the sealed space, and means for heating at least one of said upper and lower heat plates.

9. A hot press according to claim 6, in which each of said upper and lower heat plates includes a support member for removably holding the associated pressure vessel.

10. A hot press according to claim 6, in which said pressure vessels comprise thin films provided on said upper and lower heat plates, each said thin film being fixedly secured watertight to the respective heat plate at a peripheral edge portion of said thin film.

* * * * *